United States Patent
Miyagi

(10) Patent No.: US 7,279,932 B2
(45) Date of Patent: Oct. 9, 2007

(54) SEMICONDUCTOR INTEGRATED CIRCUIT DEVICE

(75) Inventor: Masanori Miyagi, Chiba (JP)

(73) Assignee: Seiko Instruments Inc. (JP)

( * ) Notice: Subject to any disclaimer, the term of this patent is extended or adjusted under 35 U.S.C. 154(b) by 82 days.

(21) Appl. No.: 11/226,585

(22) Filed: Sep. 14, 2005

(65) Prior Publication Data

US 2006/0066348 A1   Mar. 30, 2006

(30) Foreign Application Priority Data

Sep. 16, 2004   (JP) .............................. 2004-270399

(51) Int. Cl.
  *G11C 11/34* (2006.01)
  *H03K 19/20* (2006.01)
  *H03K 19/0175* (2006.01)
(52) U.S. Cl. .................. 326/81; 365/185.33; 326/113; 326/63
(58) Field of Classification Search ................. 326/80, 326/81, 82, 83, 86
See application file for complete search history.

(56) References Cited

U.S. PATENT DOCUMENTS

| | | | | |
|---|---|---|---|---|
| 4,916,334 A | * | 4/1990 | Minagawa et al. ......... 326/103 |
| 5,136,541 A | * | 8/1992 | Arakawa ............... 365/185.23 |
| 5,208,488 A | * | 5/1993 | Takiba et al. ................. 327/77 |
| 5,590,074 A | * | 12/1996 | Akaogi et al. ......... 365/185.22 |
| 6,169,690 B1 | * | 1/2001 | Iwahashi ............... 365/185.24 |
| 6,768,338 B1 | * | 7/2004 | Young et al. .................. 326/44 |
| 2002/0060928 A1 | * | 5/2002 | Iwahashi ............... 365/185.18 |
| 2004/0202025 A1 | * | 10/2004 | Seki et al. ............. 365/185.29 |

* cited by examiner

Primary Examiner—Vibol Tan
Assistant Examiner—Thienvu Tran
(74) Attorney, Agent, or Firm—Adams & Wilks

(57) ABSTRACT

A semiconductor integrated circuit device has an electrically rewritable non-volatile memory that operates with a first power supply, and a second circuit that operates with a second power supply having a voltage lower than the voltage of the first power supply. The second circuit has a gate oxide film which is thinner than the gate oxide file of the electrically rewritable non-volatile memory. A depletion NMOS transistor has a gate connected to the second power supply, a gate oxide film whose thickness is the same as that of the gate oxide film of the electrically rewritable non-volatile memory, and transmits a signal from an output terminal of the electrically rewritable non-volatile memory to an input terminal of the second circuit.

1 Claim, 4 Drawing Sheets

PRIOR ART

High voltage operation circuit    Low voltage operation circuit

SEMICONDUCTOR INTEGRATED CIRCUIT DEVICE

BACKGROUND OF THE INVENTION

1. Field of the Invention

The present invention relates to a semiconductor integrated circuit device having a level shifter for carrying out signal transmission between circuits operating at different power supply voltages.

2. Description of the Related Art

When an electrically rewritable non-volatile semiconductor memory device constructed by MOS transistors has a mixture of both circuits operating at a high voltage and at a low voltage, generally a gate oxide film of a MOS transistor for the high voltage circuit is formed thicker than that of a MOS transistor for the low voltage circuit to secure reliability. When a signal is transmitted from the high voltage circuit to the low voltage circuit, a circuit for shifting the level is required between the two circuits. One of the most widely used level shifter is shown in FIG. 4, in which an inverter circuit, which is composed of MOS transistors having a thick gate oxide film, is inserted between a high voltage circuit and a low voltage circuit, and is driven at a low power supply voltage (for example, refer to JP 10-242434 A (p.9, FIG. 3)).

Hereinafter, description will be made of a conventional semiconductor integrated circuit device having a level shifter with reference to FIG. 4.

A PMOS transistor 1 formed of a thick gate oxide film and an NMOS transistor 2 formed of a thick gate oxide film constitute an inverter 51 operating at a high voltage Vpp. A PMOS transistor 3 formed of a thin gate oxide film and an NMOS transistor 4 formed of a thin gate oxide film constitute an inverter 52 operating at a low voltage Vdd. An output signal from the inverter 51 enters to an input terminal of an inverter 53 composed of a PMOS transistor 5 formed of a thick gate oxide film and an NMOS transistor 6 formed of a thick gate oxide film. At this point, since a source electrode of the PMOS transistor 5 formed of a thick gate oxide film is connected to the low voltage Vdd, the output amplitude level ranges from Vdd to GND even when the amplitude level of the input ranging from Vpp to GND. The inverter 53 constituted by the PMOS transistor 5 formed of a thick gate oxide film and the NMOS transistor 6 formed of a thick gate oxide film works as a level shifter, and is, accordingly, able to-transmit an output signal from the high voltage circuit to the low voltage circuit.

When the number of level shifters mounted on a conventional semiconductor integrated circuit device is large, however, the area of the level shifters becomes large with respect to the area of the entire semiconductor integrated circuit device. Since size-reduction for the MOS transistor having a thick gate oxide film is more difficult than that for the MOS transistor having a thin gate oxide film, in the semiconductor integrated circuit device having a large number of level shifters it has been a problem that the area of its chip becomes extremely large, which leads to increased manufacturing cost.

SUMMARY OF THE INVENTION

The present invention has been made in view of the above, and an object of the present invention is to provide a semiconductor integrated circuit device in which a level shifter, which sends a signal from a circuit operating at a high voltage to a circuit operating at a low voltage, is composed of a depletion NMOS transistor; and a drain, a source, and a gate of the transistor are respectively connected with an output terminal of a first circuit, an input terminal of a second circuit, and a second power supply.

Further, in the case where a gate oxide film of the transistors used in the first circuit is thicker than that of the transistors used in the second circuit, the depletion NMOS transistor has a gate oxide film having the same thickness as that of the gate oxide film used in the first circuit.

According to a third aspect of the present invention, a semiconductor integrated circuit device includes: a semiconductor substrate having two gate oxide films different in thickness; a first circuit and a second circuit operating at two different power supply voltages respectively, and a depletion NMOS transistor connected between the first circuit and the second circuit on the semiconductor substrate, wherein the gate oxide film of a MOS transistor that forms the first circuit is thicker than that of a MOS transistor that forms the second circuit; the power supply voltage supplied to the first circuit is higher than the power supply voltage supplied to the second circuit; the depletion NMOS transistor includes a gate oxide film having the same thickness as that of the MOS transistor that forms the first circuit; a drain electrode of the depletion NMOS transistor is connected with a signal output terminal of the first circuit; a source electrode of the depletion NMOS transistor is connected with a signal input terminal of the second circuit; a gate electrode of the depletion NMOS transistor is connected to the power supply voltage supplied to the second circuit; and the first circuit has functions of rewriting desired data into an electrically rewritable non-volatile memory element and reading data from the non-volatile memory element.

As described above, since the level shifter is composed of the depletion NMOS transistor with its gate electrode fixed to the power supply voltage of the low voltage operation circuit, a semiconductor integrated circuit device having both the high voltage operation portion and the low voltage operation portion can be easily realized.

DETAILED DESCRIPTION OF THE PREFERRED EMBODIMENTS

Figure 1:
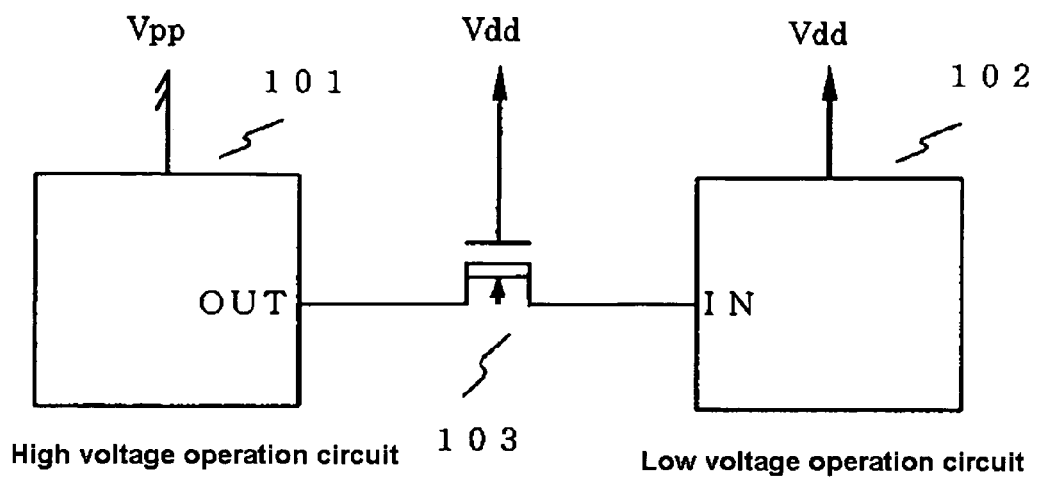
FIG. 1 shows a block diagram of a semiconductor integrated circuit device including a level shifter in accordance with Embodiment 1 of the present invention.

FIG. 1 shows a block diagram of a semiconductor integrated circuit device including a level shifter in accordance with Embodiment 1 of the present invention.

A high voltage operation circuit 101 operates at Vpp which is high as a power supply voltage, and a low voltage operation circuit 102 operates at a low voltage Vdd. For example, in the case where the semiconductor integrated circuit device is composed of a non-volatile memory device, the high voltage operation circuit 101 operates at a voltage Vpp approximately from 12 V to 20 V, and the low voltage operation circuit 102 operates at a voltage Vdd approximately from 0.9 V to 5.5 V.

An output terminal of the high voltage operation circuit 101 is connected to a drain electrode of a depletion NMOS transistor 103, and an input terminal of the low voltage operation circuit 102 is connected to a source electrode of the depletion NMOS transistor 103. A gate electrode of the depletion NMOS transistor 103 is connected to a power supply voltage Vdd of the low voltage operation circuit 102. In general, in an NMOS transistor, in the case where the potential of a gate electrode is lower than that of a drain electrode, the voltage conducted to a source electrode does not exceed the voltage applied to the gate electrode. For example, even if a signal with an amplitude of 20 V is added to the drain electrode of the depletion NMOS transistor 103 from the high voltage operation circuit that operates at Vpp, only a signal with an amplitude of 5 V or less is added to the input terminal of the low voltage operation circuit portion 102 as long as the gate voltage is fixed to the potential Vdd of 5 V. Signal level shifting is thus performed.

Further, in terms of characteristics of the NMOS transistor, a voltage which is conducted from the drain electrode to the source electrode cannot exceed a voltage obtained by subtracting a threshold voltage of the NMOS transistor from the voltage applied to the gate electrode. It is therefore important that the NMOS transistor 103 is a depletion type whose threshold voltage is negative. In the case where the NMOS transistor 103 is an enhancement type, a signal may not be sufficiently conducted to the low voltage operation circuit 102, since the voltage conducted to the source electrode cannot reach to Vdd.

Figure 4:
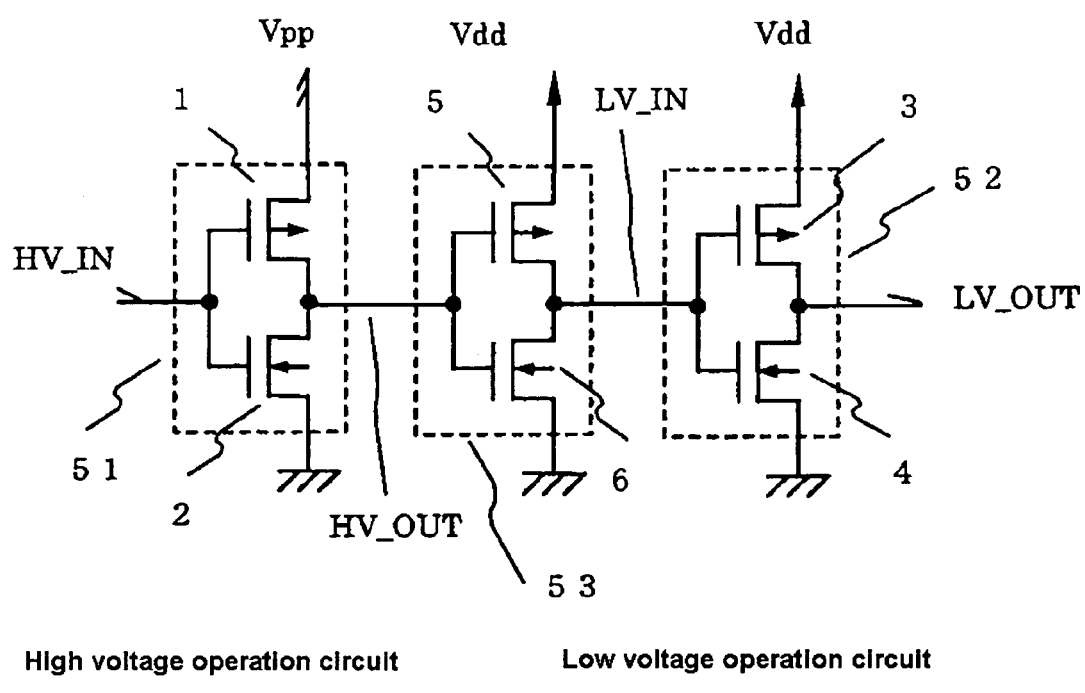
FIG. 4 shows a circuit diagram of a conventional semiconductor integrated circuit device including a level shifter.

By setting the NMOS transistor 103 as a depletion type easily enables the amplitude of the signal conducted to the low voltage operation circuit 102 to fit to the operation voltage of the low voltage operation circuit 102 without any additional circuit, and also enables the reduction in the number of elements compared to the conventional circuit shown in FIG. 4.

Embodiment 2

Figure 2:
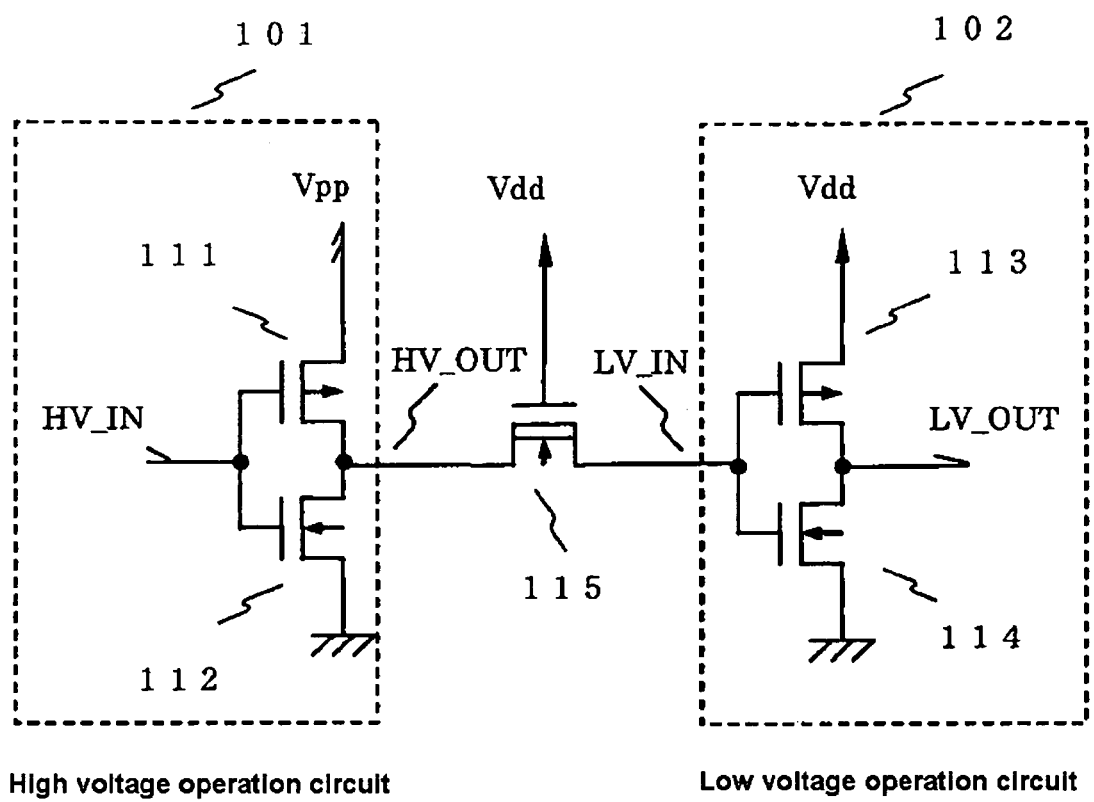
FIG. 2 shows a circuit diagram of a semiconductor integrated circuit device including a level shifter in accordance with Embodiment 2 of the present invention.

FIG. 2 shows a circuit diagram of a semiconductor integrated circuit device including a level shifter in accordance with Embodiment 2 of the present invention. A high voltage operation inverter circuit, which is composed of a PMOS transistor 111 and an NMOS transistor 112 each having a thick gate oxide film, is shown as a structural example of the high voltage operation circuit 101. Also, a low voltage operation inverter circuit, which is composed of a PMOS transistor 113 and an NMOS transistor 114 each having a thin gate oxide film, is shown as a structural example of the low voltage operation circuit 102. A depletion NMOS transistor 115 has a thick gate oxide film similar to that in the high voltage operation circuit 101, thereby having a high withstanding voltage structure.

As in Embodiment 1, since the depletion NMOS transistor 115, whose gate potential is fixed to Vdd, is used as a level shifter, the amplitude of the signal conducted to the low voltage operation circuit portion can be easily fitted to the operation voltage of the low voltage operation circuit without any additional circuit. The number of elements can also be reduced in comparison with the conventional circuit shown in FIG. 4.

Embodiment 3

Figure 3:
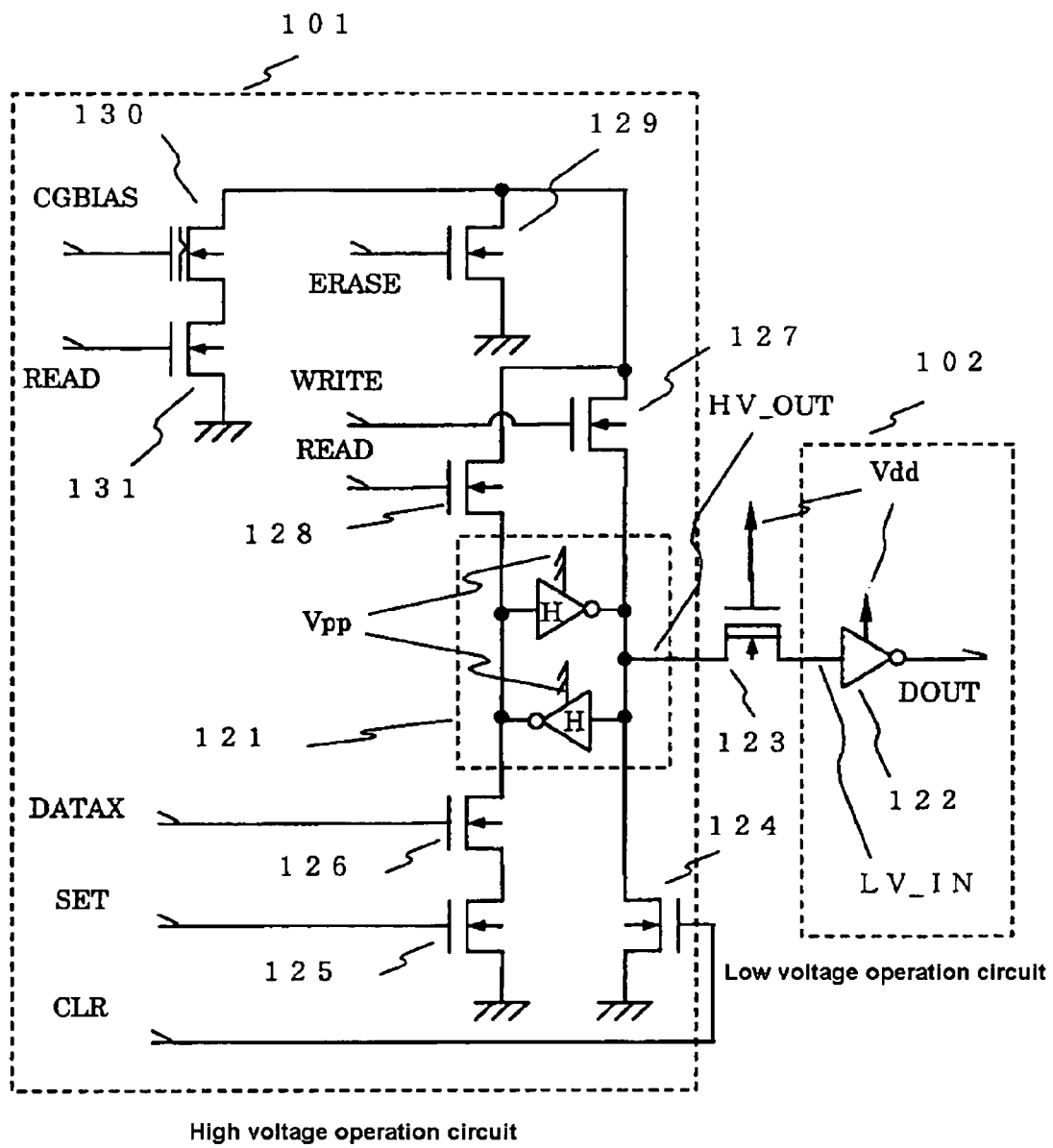
FIG. 3 shows a circuit diagram of a semiconductor integrated circuit device including an electrically rewritable non-volatile memory function in accordance with Embodiment 3 of the present invention.

FIG. 3 is a circuit diagram of a semiconductor integrated circuit device having an electrically rewritable non-volatile memory function in accordance with Embodiment 3 of the present invention. In FIG. 3, the electrically rewritable non-volatile memory circuit is shown as an example of the high voltage operation circuit 101.

In this implementation when a data is stored into the non-volatile memory element 130, first, the ERASE signal, which is applied to a gate electrode of the NMOS transistor 129 having a thick gate oxide film, is set to "H", thereby turning on the NMOS transistor 129. At the same time, the CGBIAS signal, which is applied to the control gate electrode of the non-volatile memory element 130, is pulled up to a high voltage Vpp of approximately from 16 V to 20 V, thereby erasing data in the non-volatile memory element 130. Electrons are then injected into the floating gate of the non-volatile memory element 130, and a data "1" is stored in the element 130.

Next, setting both the SET signal and the DATAX signal to make both the NMOS transistors 125 and 126 turn on, data is set in a latch circuit 121 composed of MOS transistors having thick gate oxide film only for bits whose data are to be "0". At this time, a power voltage supplied to the latch circuit 121 is equal to the power voltage Vdd supplied to the low voltage operation portion. Further, although only one bit of the non-volatile memory element is shown in FIG. 3, a plurality of the circuits shown in FIG. 3 are provided in an actual semiconductor integrated circuit and one of "0" or "1" is written accordingly in each bit as a data.

After data is set in the latch circuit 121, the WRITE signal applied to the gate electrode of the NMOS transistor 127 and the power voltage supplied to the latch circuit 121 are both raised to the high voltage in the range from 16V to 20V from the Vdd level, and at the same time the CGBIAS signal is set to a 0 V, which is the ground level. The electrons in the floating gate of the non-volatile memory element 130 are pulled out, and the data "0" is stored into the non-volatile memory element 130.

At this point, in a bit into which a data "0" is written, the output node HV_OUT of the latch circuit 121 raises to the high voltage in the range from 16V to 20V. However, the input to the inverter element 122, which operates at a low voltage, is protected by the depletion NMOS transistor 123 whose gate electrode is connected to the Vdd potential. Thus, the voltage of the node LV_IN rises only to the Vdd potential.

Although only one bit of the non-volatile memory element is shown in FIG. 3, a plurality of the circuits shown in FIG. 3 are provided in an actual semiconductor integrated circuit and one of "0" or "1" is written accordingly in each bit as a data.

When the data written into the non-volatile memory element 130 is read, the Vpp potential is set equal to the Vdd potential. First, a CLR signal is temporarily set to "H" to clear the latch circuit. Then, a READ signal is set to "H", and a predetermined bias voltage necessary for reading is applied as the CGBIAS signal. Consequently, the latch circuit 121 which is connected to a non-volatile memory element 130 storing a data "0" is inverted by utilizing a cell current flowing through the non-volatile memory element 130. At this point, the latch circuit 121 connected to a non-volatile memory element 130 in which the data "1" is stored does not change from the previously cleared state.

As described above, in a semiconductor integrated circuit with an extremely large signal transmission rate between the high voltage operation circuit and the low voltage operation circuit, such as a non-volatile memory circuit, the semiconductor integrated circuit device which includes the non-volatile memory circuit having an extremely small area can be realized by composing the level shifter with a depletion NMOS transistor.

What is claimed is:

1. A semiconductor integrated circuit device, comprising:
an electrically rewritable non-volatile memory element which operates with a first power supply and includes a gate oxide film having a first thickness
a second circuit which operates with a second power supply having a voltage lower than a voltage of the first power supply and includes a gate oxide film having a second thickness which is thinner than the first thickness of the gate oxide film; and
a depletion NMOS transistor which has a drain connected with an output terminal of the electrically rewritable non-volatile memory element, a source connected with an input terminal of the second circuit, a gate connected with the second power supply, and a gate oxide film having a thickness equal to the thickness of the electrically rewritable non-volatile memory element, and which transmits a signal from the output terminal of the electrically rewritable non-volatile memory element to the input terminal of the second circuit.

* * * * *